(12) United States Patent
Edwards

(10) Patent No.: US 11,532,710 B2
(45) Date of Patent: Dec. 20, 2022

(54) LATERALLY DIFFUSED METAL OXIDE SEMICONDUCTOR DEVICE WITH ISOLATION STRUCTURES FOR RECOVERY CHARGE REMOVAL

(71) Applicant: Texas Instruments Incorporated, Dallas, TX (US)

(72) Inventor: Henry Litzmann Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/434,610

(22) Filed: Feb. 16, 2017

(65) Prior Publication Data

US 2018/0233561 A1  Aug. 16, 2018

(51) Int. Cl.
*H01L 29/06* (2006.01)
*H01L 29/10* (2006.01)
*H01L 29/78* (2006.01)
*H01L 29/417* (2006.01)
*H01L 29/423* (2006.01)

(52) U.S. Cl.
CPC ...... *H01L 29/1095* (2013.01); *H01L 29/0653* (2013.01); *H01L 29/0696* (2013.01); *H01L 29/41766* (2013.01); *H01L 29/7835* (2013.01); *H01L 29/42368* (2013.01)

(58) Field of Classification Search
CPC ............ H01L 29/1083; H01L 29/1095; H01L 29/7816
See application file for complete search history.

(56) References Cited

U.S. PATENT DOCUMENTS

| 4,937,647 A * | 6/1990 | Sutton | H03K 17/567 257/133 |
| 9,209,169 B1 * | 12/2015 | Lee | H01L 29/7816 |
| 2007/0246773 A1 * | 10/2007 | Pendharkar | H01L 29/41 257/344 |
| 2009/0256212 A1 * | 10/2009 | Denison | H01L 29/0653 257/408 |
| 2012/0094457 A1 * | 4/2012 | Gabrys | H01L 29/0653 438/286 |
| 2014/0001477 A1 * | 1/2014 | Chen | H01L 21/823481 257/66 |
| 2014/0252472 A1 * | 9/2014 | Chen | H01L 29/7816 257/339 |
| 2014/0320174 A1 * | 10/2014 | Lu | H01L 29/402 327/109 |
| 2017/0346477 A1 * | 11/2017 | Xia | H01L 29/51 |
| 2018/0130903 A1 * | 5/2018 | Lin | H01L 29/47 |

* cited by examiner

*Primary Examiner* — Eugene Lee
(74) *Attorney, Agent, or Firm* — Jacqueline J. Garner; Frank D. Cimino

(57) ABSTRACT

A system and method for a Laterally Diffused Metal Oxide Semiconductor (LDMOS) with Shallow Trench Isolation (STI) in the backgate region of FET with trench contacts is provided. The backgate diffusion region of the FET is split in the middle of the source-backgate side of the LDMOS with a strip of STI. A contact can be drawn across STI strip. The contact etch can be etched through the STI fill. The contact barrier material and trench fill processes can create a metal-semiconductor contact in the outline of the STI.

15 Claims, 5 Drawing Sheets

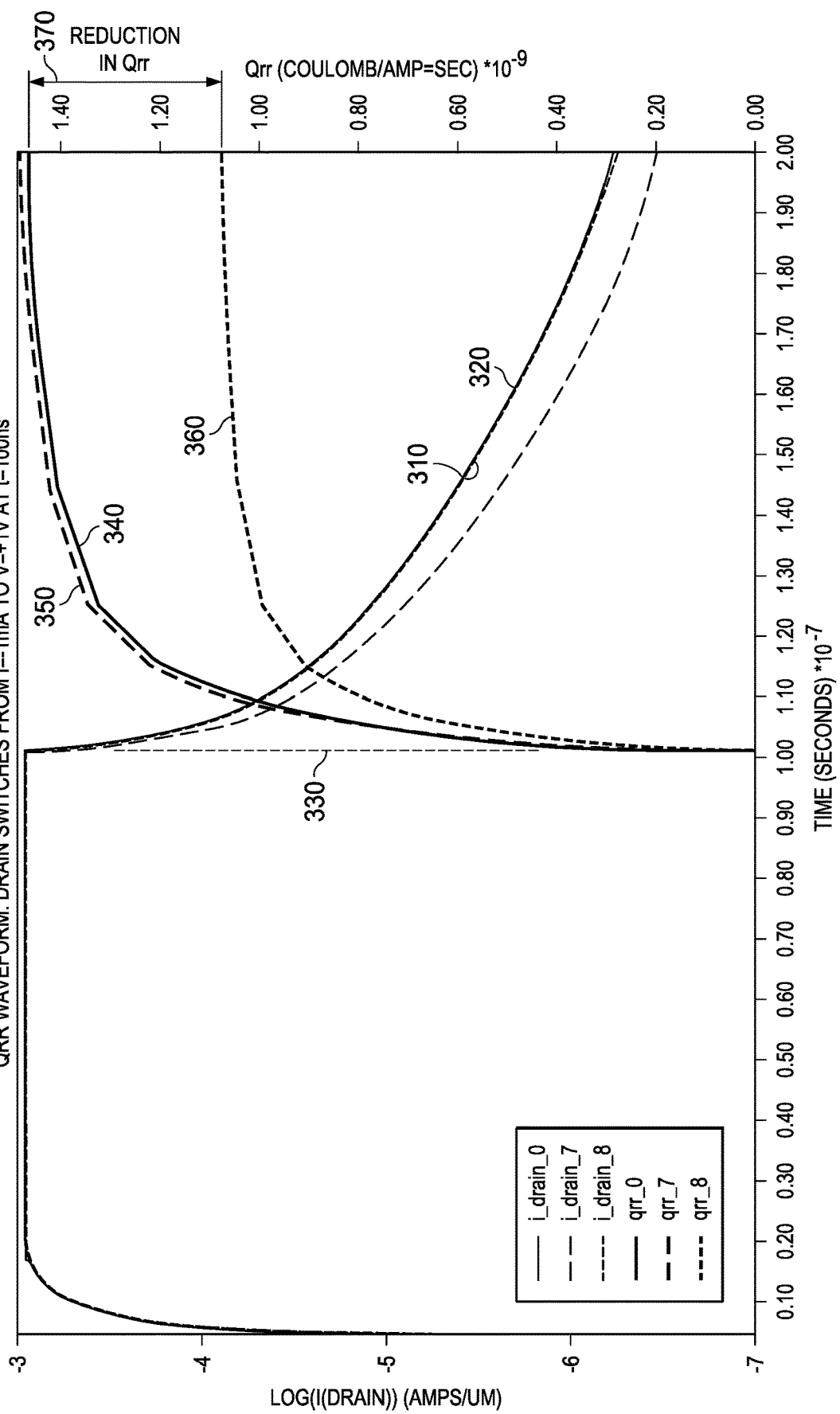

LATERALLY DIFFUSED METAL OXIDE SEMICONDUCTOR DEVICE WITH ISOLATION STRUCTURES FOR RECOVERY CHARGE REMOVAL

TECHNICAL FIELD

This disclosure relates generally to the field of semiconductor integrated circuits and more specifically to laterally diffused metal oxide semiconductor devices with shallow trench isolations in backgate region.

BACKGROUND

Generally, Laterally Diffused Metal Oxide Semiconductor (LDMOS) devices are asymmetric power transistors designed for low on-resistance and high blocking voltage. In power Field Effect Transistors (FET), such as LDMOS adopting Bipolar-Complementary Metal-Oxide-Semiconductor DMOS (BCD) technologies, the resistance of metal is increasingly becoming a limitation for the efficiency of power switching circuits. Some power FETs are built as a planar device or with a dedicated field-relief oxide, which can be made on a single solid active geometry (i.e. silicon not containing field oxide). Typically, active regions are isolated by isolation structures such as shallow trench isolation to prevent cross-talk between device arrays. The active regions are generated using a set of density rules that determine the active area and placement on the substrate. For large devices arrays, which are generally common in power circuits, the density rules are violated, requiring that the power FETs be broken into smaller pieces at the semiconductor die area at the expense of adding isolation structures and sufficient non-active space to meet the active region density rules.

As switching power circuits increase in frequency, switching transients such as diode reverse-recovery charge (Qrr) become increasingly important. In particular, Qrr gets worst when a large volume of p-type materials is available in the power FET body region, which forms a wide base of the parasitic NPN. The time to diffuse out Qrr of the base of FET can be very long (e.g., 10's of nsec) for a wide base region.

Referring to FIG. 1, a conventional LDMOS FET device 100 is illustrated. The device 100 includes a substrate 105 with a diffused p-well, p– body region 110 and a diffused n-well, n– drift region 120. The p– body region 110 and n– drift region 120 are lightly doped regions. A heavily doped p+ body region 120 is diffused in the p– body region 110. The p– body region 110 further includes a heavily doped p+ source backgate region 125. A heavily doped n+ source 130 is diffused in the source backgate region 125 to provide source terminal for the device 100. A poly gate 140 is patterned over the p-body region 110 and the n– drift region 120 to provide gate electrode functions. The poly gate 140 can be formed using a polysilicon, silicide-clad polysilicon, metal, or other known conductive material suitable for use as a transistor gate. A drain region 150 is heavily doped n+ type and formed into the surface of n– drift region 120 (n-well). Contacts 160-1, 160-2, and 160-3 are provided in the source backgate region 125, source region 130 and drain region 150 respectively. The contact layout in FIG. 1 shows separate contacts for the source region 130 and the backgate region 125. Alternatively, a silicide layer may short out the n-type source 130 to the p-type backgate 125, and a single row of contacts (centered on the p-type backgate) would be used.

During a power-on operation, when the transistor device 100 is turned on by applying appropriate voltages to source 130, gate 140, and drain 150, electrons flow from the source region 130 to the drain 150 along a channel formed under the gate 140. When electrons reach n-well/n– drift region 120, they continue to 'drift' towards the drain 150. When the transistor device 100 is turned off, it results in switching transients Qrr through the channel in the base region and the transistor device 100 can enter into a reverse breakdown condition causing irreversible damage to the device. The reverse recovery charge (Qrr) is actually due to a different turn-off process, namely the drain-to-body diode turn off. When the low side FET turns off, which means that the inductor will be driving current into the drain of the low side FET, causing the drain-body junction to go into forward bias, which fills the doped Si with minority carriers (electrons in the p-type body and holes in the n-type drift region). The injected minority carriers make up the reverse recovery charge Qrr. As the high side FET turns on, it pulls up the drain of the low-side FET; however, the low-side FET is still collecting minority carriers (Qrr), so that current will be flowing as the drain voltage increases. The product of this current flow and the drain voltage represents a switching energy loss.

Over the years, many solutions have been proposed to reduce the minority carrier lifetime in the base region, such as for example electron irradiation, mid-gap metal impurity introduction, and parasitic cathode introduction. None of these solutions are suitable for use in a high-performance, advanced power process for various reasons.

SUMMARY

In accordance with an embodiment an integrated circuit is disclosed. The integrated circuit includes a substrate, a p-type body region diffused in the substrate, an n-type drift region diffused in the substrate, wherein the p-type body region and the n-type drift region forming a base channel for electron and hole injection during a forward bias of the integrated circuit, a p-type source backgate region diffused in the p-type body region at the surface of the substrate providing a source backgate terminal for the integrated circuit, an n-type source region diffused in the p-type source backgate region providing a source terminal for the integrated circuit, an n-type drain region diffused in the n-type drift region providing a drain terminal for the integrated circuit, a poly gate structure formed on the substrate between the n-type source region and the n-type drain region providing a gate terminal for the integrated circuit, and a Shallow Trench Isolation (STI) region formed in the source backgate region, the STI extending through the source backgate region into the p-type body region.

In accordance with another embodiment, a Laterally Diffused Metal Oxide Semiconductor (LDMOS) transistor is disclosed. The LDMOS transistor includes a substrate, a p-type body region diffused in the substrate, an n-type drift region diffused in the substrate, wherein the p-type body region and the n-type drift region forming a base channel for electron and hole injection during a forward bias of the LDMOS transistor, a p-type source backgate region diffused in the p-type body region at the surface of the substrate providing a source backgate terminal for the integrated circuit, an n-type drain region diffused in the n-type drift region providing a drain terminal for the integrated circuit, at least one Shallow Trench Isolation (STI) region formed in one or more of the source backgate region and the drain region, an n-type source region diffused in the p-type source backgate region providing a source terminal for the integrated circuit, and a poly gate structure formed on the substrate between the n-type source region and the n-type drain region providing a gate terminal for the LDMOS transistor.

In accordance with yet another embodiment, a Laterally Diffused Metal Oxide Semiconductor (LDMOS) is disclosed. The LDMOS transistor includes a substrate, a p-type body region diffused in the substrate, an n-type drift region diffused in the substrate, wherein the p-type body region and the n-type drift region forming a base channel for electron and hole injunction during a forward bias of the LDMOS transistor, a p-type source backgate region diffused in the p-type body region at the surface of the substrate providing a source backgate terminal for the integrated circuit, and a Shallow Trench Isolation (STI) region formed in the source backgate region, the STI extending through the source backgate region into the p-type body region.

BRIEF DESCRIPTION OF THE DRAWINGS

FIG. 3 illustrates an exemplary waveform display for diffusion curves of diode reverse recovery charges and drain current for various devices according to an embodiment.

DETAILED DESCRIPTION

The following description provides many different embodiments, or examples, for implementing different features of the subject matter. These descriptions are merely for illustrative purposes and do not limit the scope of the invention.

According to an embodiment, a system, method, and device is provided for a LDMOS with an isolation structure, such as a shallow trench isolation (STI) structure, in the backgate region of FET with trench contacts. The backgate diffusion region of the FET is split in the middle of the source-backgate side of the LDMOS with a strip of STI structure. A contact can be formed across STI strip. The contact etch can be etched through the STI fill. The contact barrier material and trench fill processes can create a metal-semiconductor contact in the outline of the STI. According to another embodiment, the STI in the backgate region is formed without a contact thus avoiding the process complexity of extending contact etch through the STI region. According to yet another embodiment, the contact patterns are formed with roughness in the edges, which prevents the swelling of the middle parts of the contact relative to the edges thus providing over etch relief for the contact structure.

According to another embodiment, the contacts through STI may be drawn wide enough to fill the source-backgate region of the FET, or it may be separated into source and backgate contact geometries. The STI contacts may also be used on the drain side. The drain active region may be split with an STI to further reduce the active region density. The trench contacts and STI stripe may be combined on the drain side to provide similar benefits to its inclusion on the source/backgate region.

Figure 1:
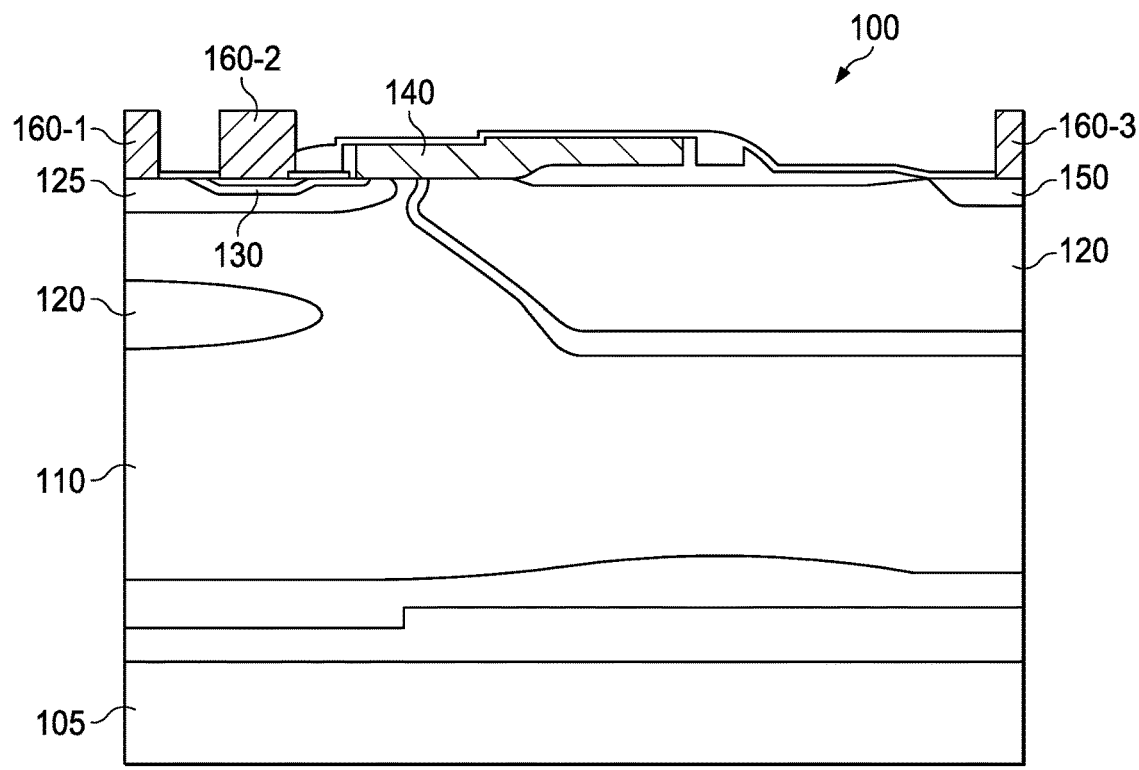
FIG. 1 illustrates a conventional LDMOS FET device.
Figure 2A:
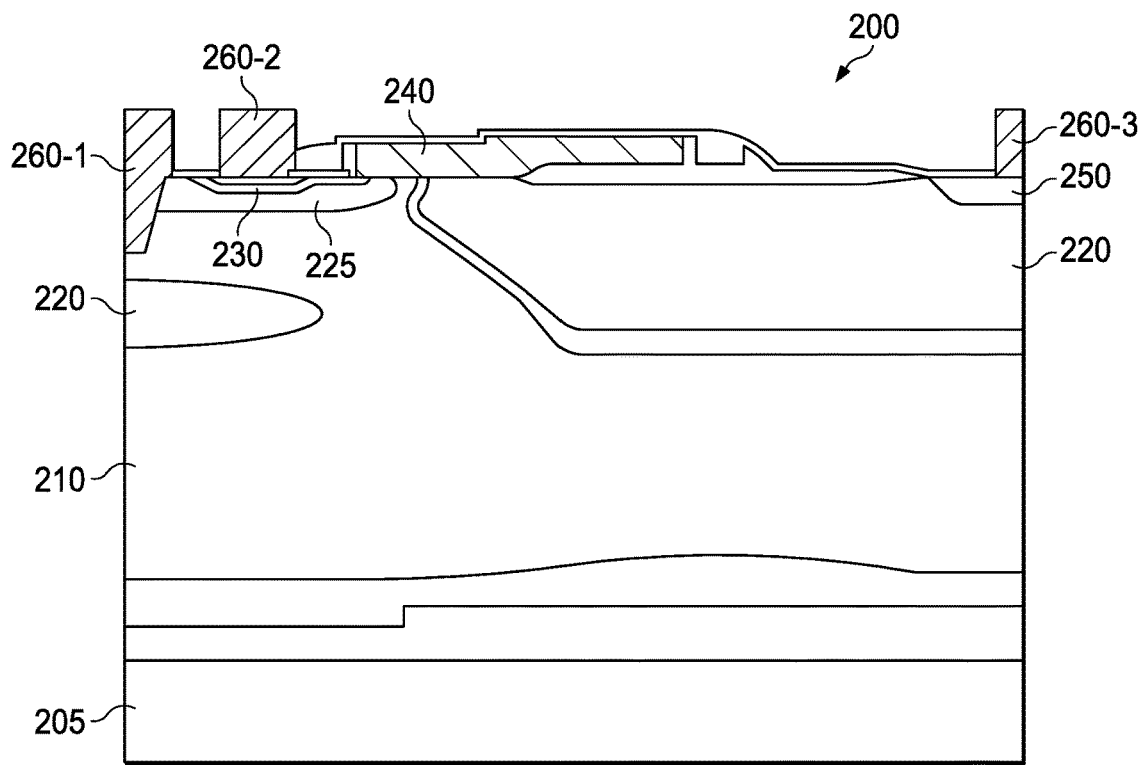
FIG. 2A illustrates an exemplary LDMOS device according to an embodiment.

Referring to FIG. 2A, illustrates an exemplary LDMOS device 200 according to an embodiment. The basic structure of device 200 is similar to the device 100 illustrated in FIG. 1. Device 200 includes substrate 205, a p-well, p− body region 210, an n-well, n− drift region 220, a heavily doped p+ body region 220, a heavily doped p+ source backgate region 225, a heavily doped n+ source 230, a poly gate 240, and a drain region 250. In general, the heavily doped regions (e.g., 230, 250, and 220) each has a higher doping concentration than the n-drift region 220. Contacts 260-1, 260-2, and 260-3 are provided in the source backgate region 225, source region 230 and drain region 250, respectively. According to an embodiment, the backgate region 225 is split with a strip of isolation structure, such as the STI structure accessed by the contact 260-1. The isolation structure is extended into the p− body region 210. A contact (e.g., 260-1) can be drawn across the STI and extending up to the source backgate region 225 to create a metal semiconductor contact region around the outline of the STI strip. In the conventional LDMOS device, during normal operation, electrons which have been injected into the p-type body during commutation are already minority carriers. The process of diffusion takes significant time because electrons diffuse to a place where they can be "collected" by a pn junction. Diffusion is a slow process, especially for regions of Si that are more than 1 um (for which diffusion times may be several nanoseconds or more). The diffusion time can be estimated using the expression for base transport time in a bipolar transistor. It goes as the square of the width of the region that the electrons much diffuse across. The slow diffusion of electrons thus extend diffusion time of diode reverse recovery charge (Qrr). The extended contact and STI strip through the p− body region 210 provide a minority carrier recombination site, resulting in higher diffusion current to remove Qrr from the p-body region and the effect of reverse current are significantly minimize.

According to another embodiment, a STI is created in the backgate region without extending the contact through the STI. That avoids the process complications of creating the STI and then extending the contact for the backgate region through the STI. According to yet another embodiment, the contact through the STI can be formed to have rough edges such as for example the edges can be formed with 'tooth' providing over-etch relief which prevents the middle part of the contact from swelling relative to the ends during normal operation of the device. While for exemplary purposes, separate contact for backgate region 225 is illustrated; however, the contact 260-1 can be extended and be wide enough to cover the entire backgate region 225. Further, the STI with contact can also be implemented in the drain region 250 to provide faster diffusion of minority carrier holes on the drain side. According to another embodiment, the density of active regions of source backgate, drain, and others in the device 200 can be selective reduced using STI to improve the diffusion time of diode reverse recovery charge. According to further embodiment, the STI can be implemented in both the source backgate region and the drain to provide further improvement in the diffusion time for Qrr.

Figure 2B:
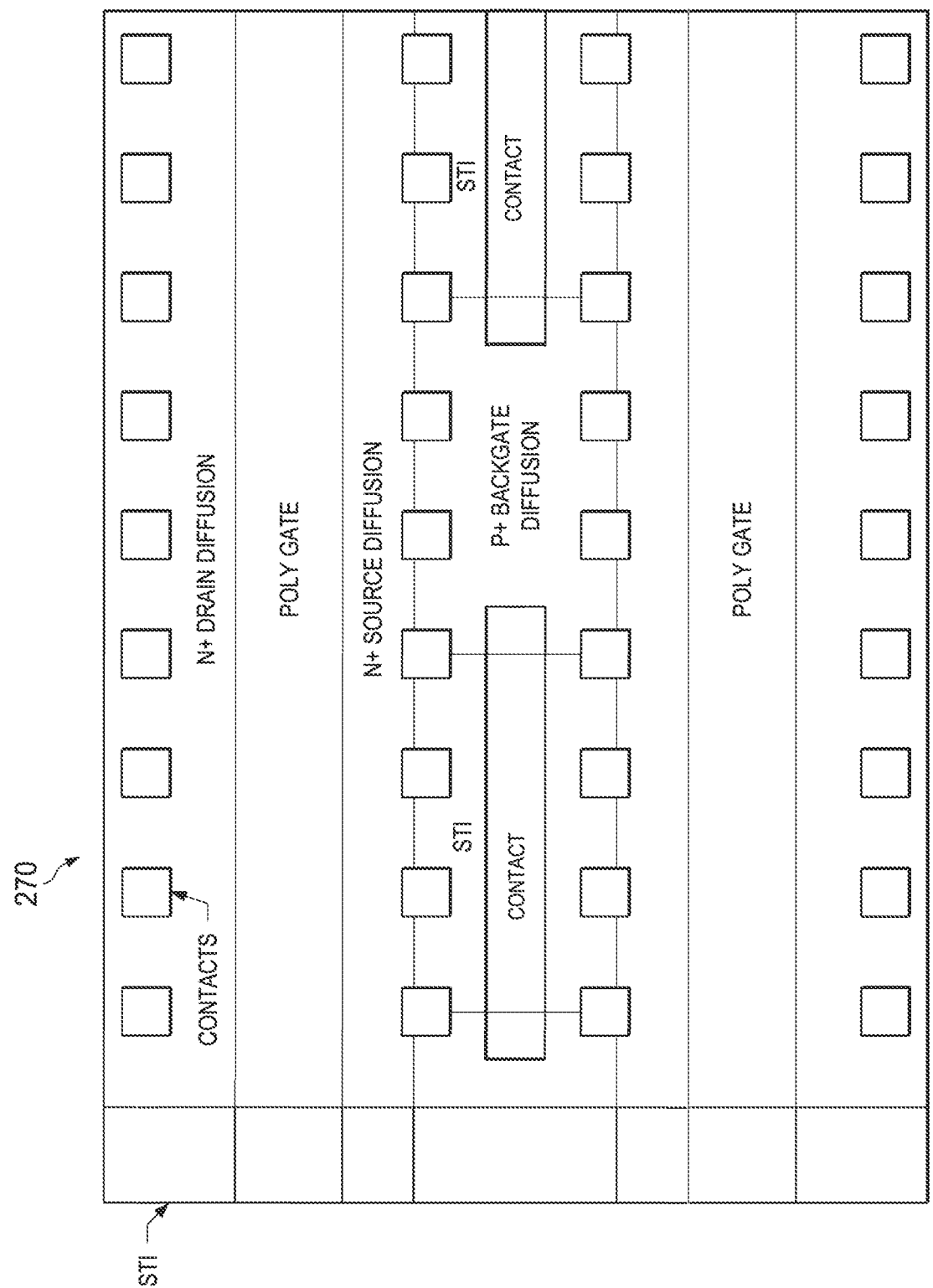
FIG. 2B illustrates an exemplary layout of a device having STI stripes according to an embodiment.

Referring to FIG. 2B, an exemplary layout 270 of a device having STI stripes is illustrated according to an embodiment. As illustrated, the layout includes STI stripes, two rows of contacts, and p+ backgate diffusion in between the STI. STI stripes can be a complete stripe in the width direction or it could be a series of dashes, which enables the contacting more robust.

Referring to FIG. 3, a waveform display 300 for diffusion curves of diode reverse recovery charges and drain current for various devices is illustrated according to an embodiment. As illustrated, waveform 310 shows drain current for conventional device such as device 100 illustrated in FIG. 1. Waveform 320 shows drain current for another conventional device similar to the device 100; however, this device included stretched backgate region to provide extended backgate region to control Qrr. The waveform 330 shows the drain current for a device according to an embodiment such as for example, device 200 as illustrated in FIG. 2. The display 300 further illustrates Qrr flow for each of the devices such as the waveform 340 shows Qrr in a conventional device such as device 100, waveform 350 shows Qrr flow for conventional device with extended backgate region, and waveform 360 shows Qrr flow in a device according to an embodiment such as device 200. As illustrated, under similar conditions, the Qrr flow in device according to an embodiment is at least 25% less than conventional devices as shown by arrow 370. The Qrr diffusion efficiency significantly improves by selectively reducing the density of active region of backgate, source, and drain using STIs according to various embodiments.

Figure 4A:
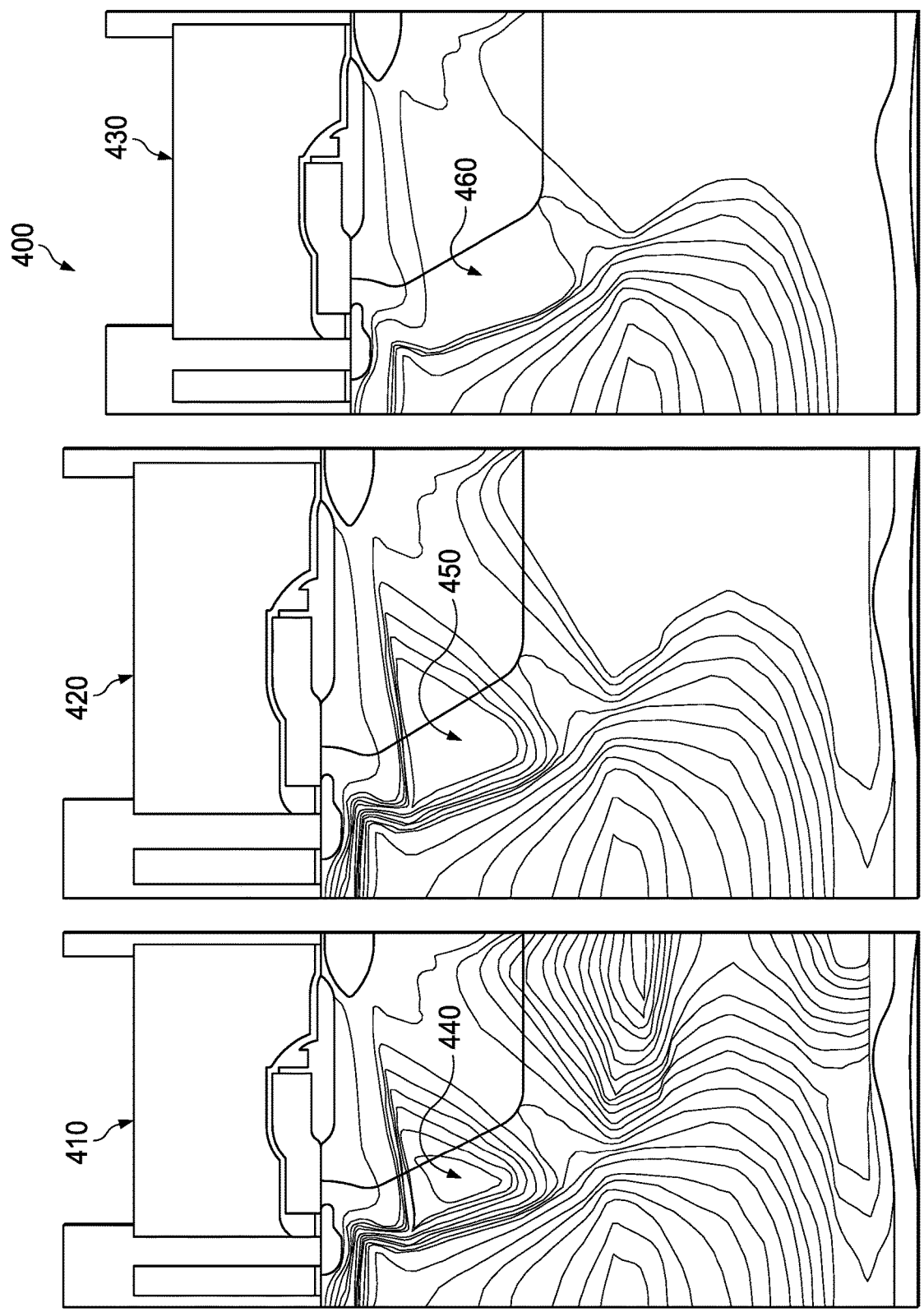
FIG. 4A illustrates an electron density diagram of various LDMOS devices according to an embodiment.

Referring to FIG. 4A, electron density diagram 400 of various LDMOS devices in p-well is illustrated according to an embodiment. The diagram 400 illustrates electron density 410 for conventional device such as device 100 illustrated in FIG. 1. Electron density diagram 420 shows electron density for another conventional device with stretched backgate region and electron density diagram 430 shows electron density for a device according to an embodiment such as for example, device 200 as illustrated in FIG. 2. As illustrated, the electron density of minority carrier electrons in the p-type body region is significantly reduced in devices with selective implementation of STI with metal filling in different regions of LDMOS according to various embodiments.

Figure 4B:
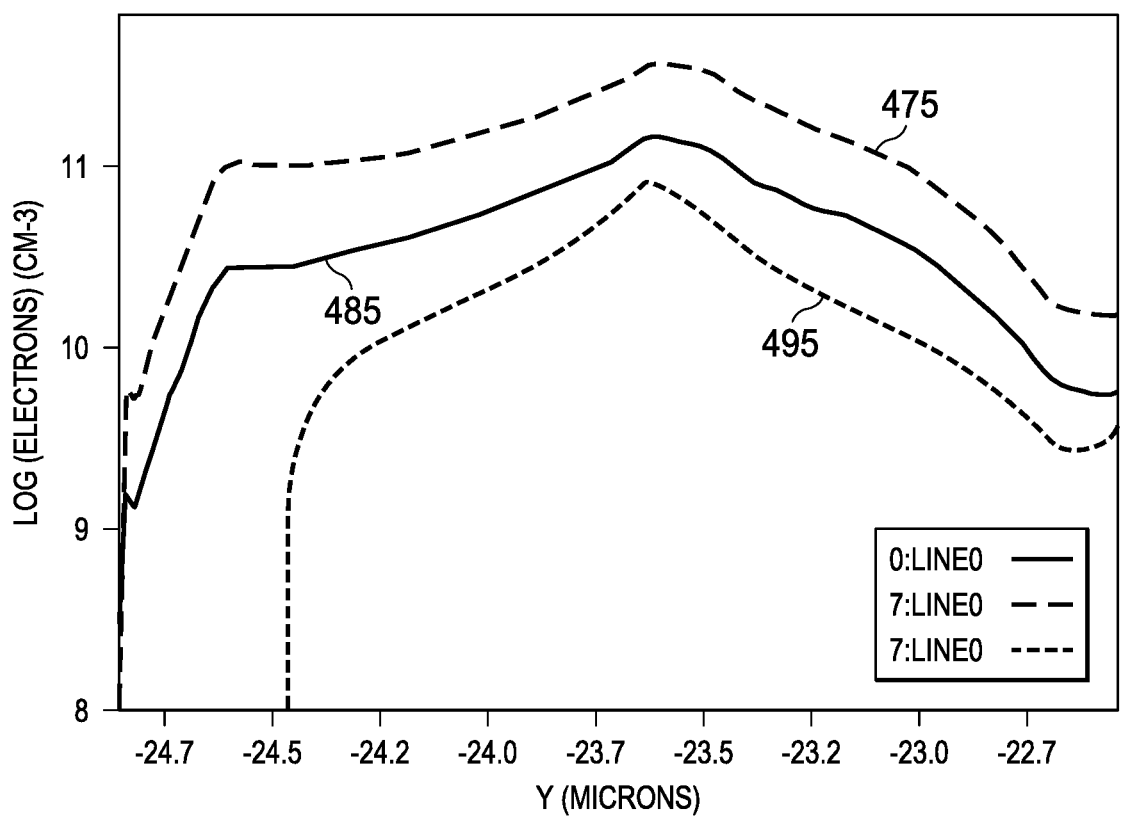
FIG. 4B illustrates the electron concentration profile for various LDMOS devices according to an embodiment.

Referring to FIG. 4B, the electron concentration profile 470 for various LDMOS devices is illustrated according to an embodiment. The diffusion current waveform 475 illustrates diffusion current for conventional device such as device 100 illustrated in FIG. 1. The diffusion current waveform 485 illustrates diffusion current for another conventional device with stretched backgate region and diffusion current waveform 495 illustrates diffusion current for a device according to an embodiment such as for example, device 200 as illustrated in FIG. 2. As illustrated, the diffusion current is significantly lower in devices with selective implementation of STI with metal filling in different regions of LDMOS according to various embodiments. By reducing the density of various active regions of the LDMOS device with selective implants of STI with metal filling according to various embodiments, significantly reduces the diode reverse recovery charge thus improving the LDMOS performance in high-frequency switching circuits.

The waveform 475 is the profile of minority carrier electrons for the conventional device illustrated in FIG. 1. The electron diffusion current near the surface (left-hand side of the graph) is given by the gradient of carriers through Fick's First Law $J=-qD\,dn/dx$. As illustrated, the diffusion current for curves 475 and 485 are similar because the slopes dn/dx of their carrier profiles are similar. The curve 495 illustrates an exemplary embodiment where the carrier profile has a much higher slope, indicating more efficient electron recombination at the bottom of the STI+ contact structure. Therefore, the minority carrier electrons are removed more efficiency from the body of the illustrated embodiment than from LDMOS constructed according to the conventional methods. Further, curve 495 shows a much lower total amount Qrr of electrons than the other two conventional profiles, indicating that it will take much less time to remove the electrons after the FET switches off.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims. Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An integrated circuit comprising: a substrate;
   a p-type body region in the substrate;
   an n-type drift region in the substrate, wherein the p-type body region and the n-type drift region are lightly doped regions;
   a p-type backgate region in the p-type body region adjacent to a surface of the substrate, and having a backgate terminal;

an n-type source region in the p-type backgate region, and having a source terminal;

an n-type drain region in the n-type drift region, and having a drain terminal;

a poly gate structure formed above the substrate between the n-type source region and the n-type drain region, and having a gate terminal;

an isolation structure in the backgate region, the isolation structure extending through the backgate region into the p-type body region, and the isolation structure splitting the p-type backgate region; and a contact terminal formed across at least a portion of the isolation structure.

2. The integrated circuit of claim 1, wherein the n-type source region is a heavily doped n-type region having a higher doping concentration than the n-type drift region.

3. The integrated circuit of claim 1, wherein the n-type drain region is a heavily doped n-type region having a higher doping concentration than the n-type drift region.

4. The integrated circuit of claim 1, wherein the backgate region is a heavily doped p-type region having a higher doping concentration than the n-type drift region.

5. A laterally diffused metal oxide semiconductor (LDMOS) transistor comprising:

a substrate;

a p-type body region in the substrate;

an n-type drift region in the substrate, wherein the p-type body region and the n-type drift region are lightly doped regions;

a p-type backgate region in the p-type body region along a surface of the substrate, and having a backgate terminal;

an n-type drain region in the n-type drift region, and having a drain terminal;

at least one isolation structure in one or more of the drain region or the p-type backgate region;

a contact terminal formed across at least a portion of the isolation structure;

an n-type source region in the p-type backgate region, and having a source terminal; and a poly gate structure formed above the substrate between the n-type source region and the n-type drain region, and having a gate terminal.

6. The LDMOS transistor of claim 5, wherein the isolation structure is formed in the backgate region and extends into the p-type body region.

7. The LDMOS transistor of claim 5, wherein the isolation structure is formed in the drain region.

8. The LDMOS transistor of claim 5, wherein the isolation structure is formed in the backgate region and the drain region.

9. The LDMOS transistor of claim 5, wherein the n-type source region is a heavily doped n-type region having a higher doping concentration than the n-type drift region.

10. The LDMOS transistor of claim 5, wherein the n-type drain region is a heavily doped n-type region having a higher doping concentration than the n-type drift region.

11. A laterally diffused metal oxide semiconductor (LDMOS) transistor comprising:

a substrate;

a p-type body region in the substrate;

an n-type drift region in the substrate, wherein the p-type body region and the n-type drift region are lightly doped regions;

a p-type backgate region in the p-type body region along a surface of the substrate, and having a backgate terminal;

an n-type source region in the p-type backgate region, and having a source terminal;

an isolation structure formed in the backgate region and extending into the p-type body region; and a contact terminal formed across at least a portion of the isolation structure.

12. The LDMOS transistor of claim 11, further comprising:

an n-type drain region in the n-type drift region, and having a drain terminal; and a poly gate structure formed above the substrate between the n-type source region and the n-type drain region, and having a gate terminal.

13. The LDMOS transistor of claim 12, wherein the n-type source region is a heavily doped n-type region having a higher doping concentration than the n- type drift region.

14. The LDMOS transistor of claim 12, wherein the n-type drain region is a heavily doped n-type region having a higher doping concentration than the n- type drift region.

15. The LDMOS transistor of claim 11, wherein the backgate region is a heavily doped p-type region having a higher doping concentration than the n- type drift region.

* * * * *